(12) United States Patent
Günther et al.

(10) Patent No.: US 8,916,403 B2
(45) Date of Patent: Dec. 23, 2014

(54) METHOD FOR PRODUCING A PLURALITY OF OPTOELECTRONIC SEMICONDUCTOR CHIPS

(75) Inventors: Ewald K. M. Günther, Regenstauf (DE); Mathias Kämpf, Burglengenfeld (DE); Jens Dennemarck, Regensburg (DE); Nikolaus Gmeinwieser, Obertraubling (DE)

(73) Assignee: OSRAM Opto Semiconductors GmbH (DE)

( * ) Notice: Subject to any disclaimer, the term of this patent is extended or adjusted under 35 U.S.C. 154(b) by 110 days.

(21) Appl. No.: 13/580,491

(22) PCT Filed: Feb. 3, 2011

(86) PCT No.: PCT/EP2011/051574
§ 371 (c)(1),
(2), (4) Date: Oct. 17, 2012

(87) PCT Pub. No.: WO2011/104097
PCT Pub. Date: Sep. 1, 2011

(65) Prior Publication Data
US 2013/0069086 A1 Mar. 21, 2013

(30) Foreign Application Priority Data
Feb. 24, 2010 (DE) .................. 10 2010 009 015

(51) Int. Cl.
H01L 21/00 (2006.01)
H01L 33/08 (2010.01)
H01L 27/15 (2006.01)
H01L 21/78 (2006.01)
B28D 5/00 (2006.01)

(52) U.S. Cl.
CPC .............. *H01L 27/153* (2013.01); *H01L 21/78* (2013.01); *B28D 5/0011* (2013.01)
USPC .............. 438/33; 438/463; 438/464; 438/465

(58) Field of Classification Search
CPC ..... B28D 5/0011; H01L 27/153; H01L 11/78
USPC .................... 438/33, 463, 464, 465
See application file for complete search history.

(56) References Cited

U.S. PATENT DOCUMENTS 5,455,455 A * 10/1995 Badehi .......................... 257/690
6,425,971 B1 * 7/2002 Silverbrook .................. 156/230
(Continued)

FOREIGN PATENT DOCUMENTS

DE 10 2004 038 339 A1 3/2005
EP 1 498 216 A1 1/2005
(Continued)

*Primary Examiner* — Mary Wilczewski
(74) *Attorney, Agent, or Firm* — DLA Piper LLP (US)

(57) ABSTRACT

A method for producing a plurality of optoelectronic semiconductor chips includes providing a carrier wafer having a first surface and a second surface opposite the first surface, wherein a plurality of individual component layer sequences spaced apart from one another in a lateral direction are applied on the first surface, the component layer sequences being separated from one another by separation trenches; introducing at least one crystal imperfection in at least one region of the carrier wafer which at least partly overlaps a separation trench in a vertical direction; singulating the carrier wafer along the at least one crystal imperfection into individual semiconductor chips.

10 Claims, 6 Drawing Sheets

(56) References Cited

U.S. PATENT DOCUMENTS

| | | | | |
|---|---|---|---|---|
| 6,465,329 | B1* | 10/2002 | Glenn | 438/462 |
| 8,183,131 | B2* | 5/2012 | Fukuyo et al. | 438/463 |
| 8,188,404 | B2* | 5/2012 | Sakamoto | 219/121.68 |
| 8,227,724 | B2* | 7/2012 | Fukuyo et al. | 219/121.65 |
| 8,247,734 | B2* | 8/2012 | Fukuyo et al. | 219/121.66 |
| 8,263,479 | B2* | 9/2012 | Fukuyo et al. | 438/460 |
| 8,268,704 | B2* | 9/2012 | Fujii et al. | 438/460 |
| 8,278,592 | B2* | 10/2012 | Sakamoto | 219/121.72 |
| 8,283,595 | B2* | 10/2012 | Fukuyo et al. | 219/121.69 |
| 8,304,325 | B2* | 11/2012 | Fujii et al. | 438/460 |
| 8,314,013 | B2* | 11/2012 | Fujii et al. | 438/460 |
| 8,338,271 | B2* | 12/2012 | Sugiura et al. | 438/463 |
| 8,361,883 | B2* | 1/2013 | Fukuyo et al. | 438/460 |
| 8,389,384 | B2* | 3/2013 | Sakamoto et al. | 438/463 |
| 8,409,968 | B2* | 4/2013 | Fukuyo et al. | 438/460 |
| 8,420,507 | B2* | 4/2013 | Kumagai | 438/463 |
| 8,431,467 | B2* | 4/2013 | Sakamoto | 438/463 |
| 8,436,273 | B2* | 5/2013 | Sakamoto | 219/121.6 |
| 8,450,187 | B2* | 5/2013 | Fukuyo et al. | 438/460 |
| 8,513,567 | B2* | 8/2013 | Osajima et al. | 219/121.72 |
| 8,518,800 | B2* | 8/2013 | Fujii et al. | 438/460 |
| 8,518,801 | B2* | 8/2013 | Fujii et al. | 438/460 |
| 8,519,511 | B2* | 8/2013 | Fujii et al. | 257/618 |
| 8,523,636 | B2* | 9/2013 | Uchiyama | 451/57 |
| 8,526,091 | B2* | 9/2013 | Ito et al. | 359/238 |
| 8,551,817 | B2* | 10/2013 | Fukumitsu et al. | 438/110 |
| 8,551,865 | B2* | 10/2013 | Fukuyo et al. | 438/463 |
| 8,563,893 | B2* | 10/2013 | Kuno et al. | 219/121.68 |
| 8,598,015 | B2* | 12/2013 | Fukuyo et al. | 438/460 |
| 8,604,383 | B2* | 12/2013 | Kuno et al. | 219/121.69 |
| 8,610,028 | B2* | 12/2013 | Kuno et al. | 219/121.67 |
| 8,624,153 | B2* | 1/2014 | Atsumi et al. | 219/121.67 |
| 8,673,745 | B2* | 3/2014 | Fukuyo et al. | 438/463 |
| 8,685,838 | B2* | 4/2014 | Fukuyo et al. | 438/463 |
| 8,703,582 | B2* | 4/2014 | Abe | 438/463 |
| 8,716,110 | B2* | 5/2014 | Fukuyo et al. | 438/463 |
| 8,722,516 | B2* | 5/2014 | Yamada et al. | 438/463 |
| 8,728,914 | B2* | 5/2014 | Sakamoto et al. | 438/462 |
| 8,728,916 | B2* | 5/2014 | Tamemoto | 438/463 |
| 8,735,770 | B2* | 5/2014 | Kuno et al. | 219/121.67 |
| 2005/0037541 | A1 | 2/2005 | Nagasawa et al. | |
| 2005/0130390 | A1 | 6/2005 | Andrews et al. | |
| 2005/0202596 | A1* | 9/2005 | Fukuyo et al. | 438/113 |
| 2005/0227455 | A1* | 10/2005 | Park et al. | 438/458 |
| 2006/0011593 | A1* | 1/2006 | Fukuyo et al. | 219/121.67 |
| 2006/0189098 | A1 | 8/2006 | Edmond | |
| 2009/0166808 | A1* | 7/2009 | Sakamoto et al. | 257/618 |
| 2010/0015783 | A1* | 1/2010 | Fukuyo et al. | 438/463 |
| 2013/0069086 | A1* | 3/2013 | Gunther et al. | 257/88 |

FOREIGN PATENT DOCUMENTS

| | | |
|---|---|---|
| EP | 1 580 800 A1 | 9/2005 |
| EP | 1 742 253 A1 | 1/2007 |
| JP | 11-163403 A | 6/1999 |
| WO | 2009/003435 A1 | 1/2009 |

* cited by examiner

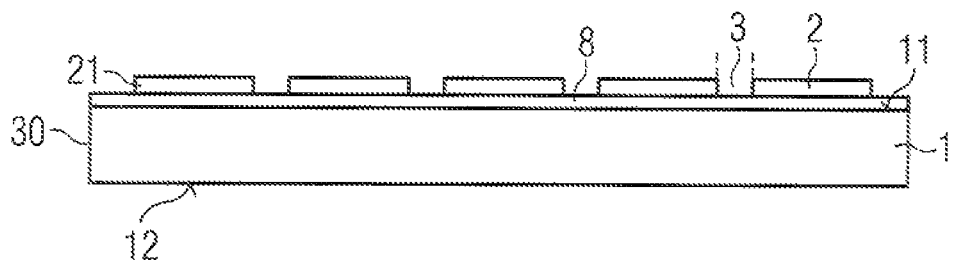
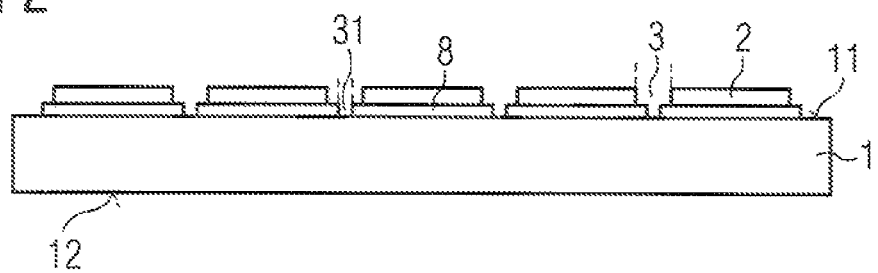
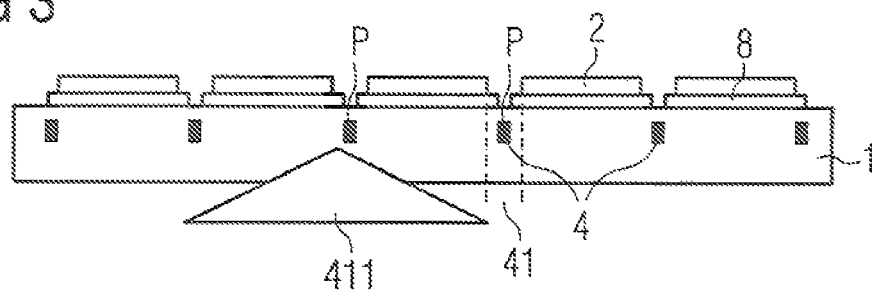

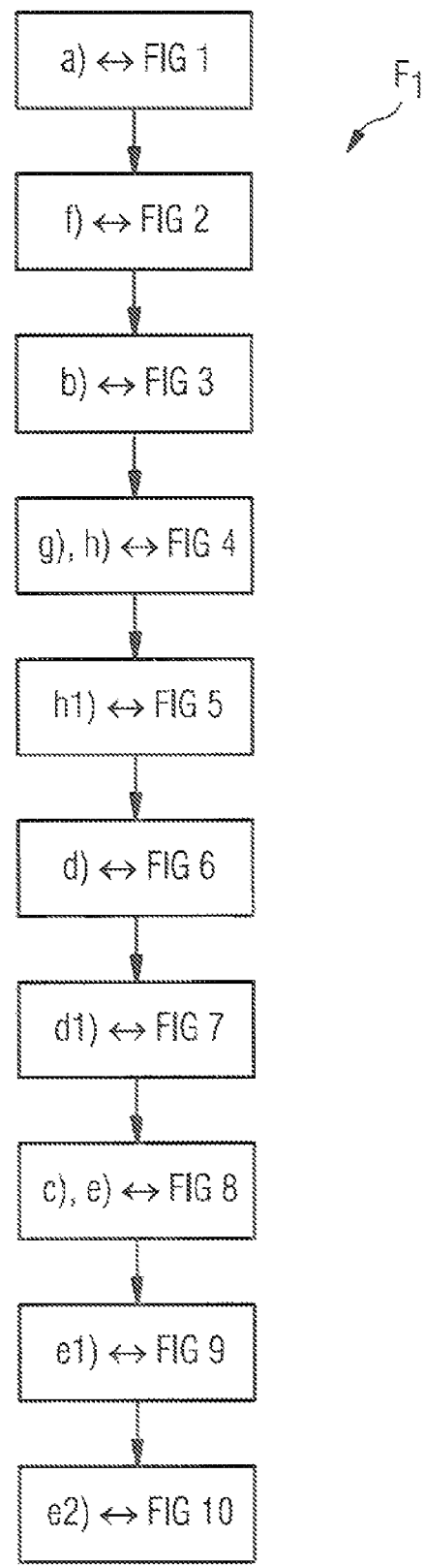

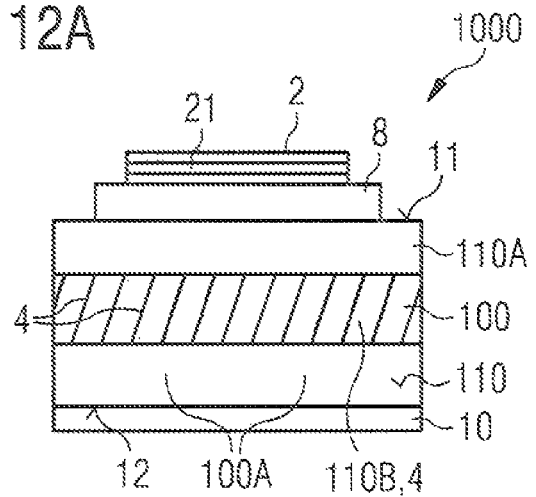
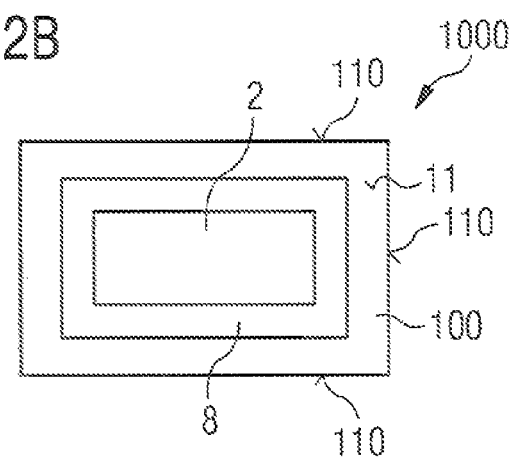
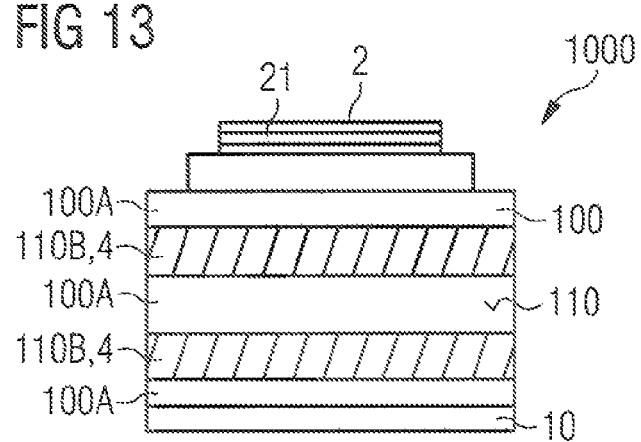

METHOD FOR PRODUCING A PLURALITY OF OPTOELECTRONIC SEMICONDUCTOR CHIPS

RELATED APPLICATIONS

This is a §371 of International Application No. PCT/EP2011/051574, with an international filing date of Feb. 3, 2011 (WO 2011/104097 A1, published Sep. 1, 2011) which is based on German Patent Application No. 10 2010 009 015.8 filed Feb. 24, 2010, the subject matter of which is incorporated herein by reference.

TECHNICAL FIELD

This disclosure relates to a cost-effective method for producing a plurality of optoelectronic semiconductor chips and an optoelectronic semiconductor chip.

SUMMARY

We provide a method for producing a plurality of optoelectronic semiconductor chips, including a) providing a carrier wafer having a first surface and a second surface opposite the first surface, wherein a plurality of individual component layer sequences spaced apart from one another in a lateral direction are applied on the first surface, said component layer sequences each being separated from one another by separation trenches; b) introducing at least one crystal imperfection in at least one region of the carrier wafer which at least partly overlaps a separation trench in a vertical direction; and c) singulating the carrier wafer along the at least one crystal imperfection into individual semiconductor chips, wherein each semiconductor chip comprises at least one component layer sequence.

We also provide an optoelectronic semiconductor chip, including a carrier having a first surface and a second surface opposite the first surface and laterally delimited by at least one side area; and at least one component layer sequence having at least one active zone that generates electromagnetic radiation, wherein the component layer sequence is arranged on the first surface, the at least one side area has at least one undisturbed region and at least one disturbed region, the at least one disturbed region has a multiplicity of crystal imperfections arranged in a lateral direction, the at least one disturbed region, in a vertical direction, is spaced apart from the at least one undisturbed region or is adjacent to the at least one undisturbed region and the undisturbed region is free of the crystal imperfections.

We further provide a method of producing a plurality of optoelectronic semiconductor chips, including a) providing a carrier wafer, having a first surface and a second surface opposite the first surface, wherein a plurality of individual component layer sequences spaced apart from one another in a lateral direction are applied on the first surface, said component layer sequences each being separated from one another by separation trenches; b) introducing at least one crystal imperfection in at least one region of the carrier wafer which at least partly overlaps a separation trench in a vertical direction; c) singulating the carrier water along the at least one crystal imperfection into individual semiconductor chips, wherein each semiconductor chip comprises at least one component layer sequence; d) an intermediate carrier applied to the second surface of the carrier wafer; e1) a further intermediate carrier applied to those surfaces of the component layer sequences remote from the intermediate carrier, wherein the intermediate carrier is removed from the individual optoelectronic semiconductor chips; and e2) a contact layer applied to surfaces of the of the optoelectronic semiconductor chips remote from the further intermediate carrier.

BRIEF DESCRIPTION OF THE DRAWINGS

FIGS. 1 to 10 show individual manufacturing steps for producing an example of an optoelectronic semiconductor chip.

FIG. 11 shows a method flowchart for producing another example of an optoelectronic semiconductor chip.

FIGS. 12A, 12B and 13 show schematic views of examples of optoelectronic semiconductor chips.

DETAILED DESCRIPTION

Figure 4:
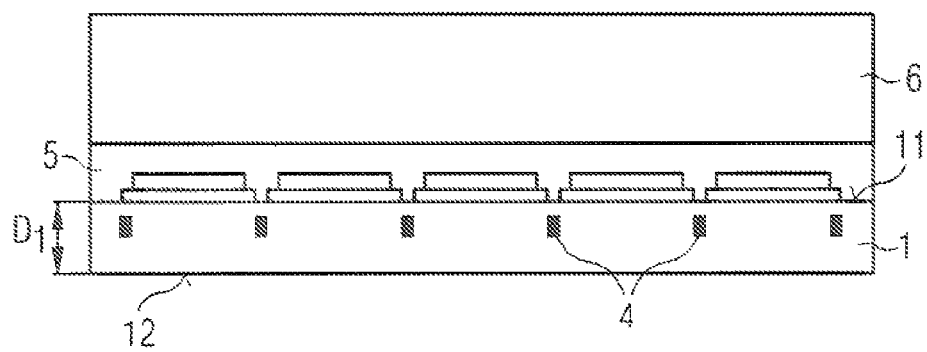

We provide a method that may comprise a step a) involving providing a carrier wafer which has a first surface and a second surface opposite the first surface. By way of example, the carrier wafer is a semiconductor wafer.

A plurality of individual component layer sequences spaced apart from one another in a lateral direction may be applied on the first surface. In this connection, "lateral" means a direction parallel to a main extension direction of the carrier wafer. The component layer sequences can be semiconductor layer sequences. By way of example, the component layer sequences are layers formed with a nitride-based compound semiconductor material. "Applied" means that the component layer sequences can be in direct contact with the first surface of the carrier wafer such that neither a gap nor an interruption is formed between the component layer sequences and the first surface. It is likewise possible for one or more intermediate layers to be arranged between the component layer sequences. The component layer sequences are then in contact with the first surface of the carrier wafer merely via such intermediate layers. Preferably, the component layer sequences are not grown epitaxially onto the carrier wafer, but rather are soldered or adhesively bonded, for example, onto the first surface of the carrier wafer. By way of example, the component layer sequences are thin-film layer sequences. The carrier wafer is then different from a growth substrate.

Furthermore, the component layer sequences are in each case separated from one another by separation trenches. In other words, the component layer sequences are then arranged in a manner spaced apart from one another in a lateral direction. In a plan view of the carrier water, the separation trenches are then delimited by the side areas of two component layer sequences respectively adjoining one another and, for example, the first surface of the carrier wafer.

Furthermore, each component layer sequence has at least one active zone suitable for generating electromagnetic radiation. By way of example, the active zone, with external electrical contact-connection, emits radiation in the range from ultraviolet to infrared light.

A step b) of the method may involve introducing at least one crystal imperfection in at least one region of the carrier wafer which at least partly overlaps an separation trench in a vertical direction. "Vertical" is a direction perpendicular to a main extension direction of the carrier wafer. In this connection, "crystal imperfection." means any alteration in the material of the carrier wafer that is produced externally, that is to say from outside. By way of example, the crystal imperfection involves tensile or compressive strains of the carrier wafer material. It is likewise possible for the crystal imperfection to be a microstructure change in which the individual crystal chains are deformed and/or partly destroyed. After the at least one crystal imperfection has been introduced into the carrier wafer, the carrier wafer remains in one piece. That is to say that the carrier wafer is not already singulated by introduction of the crystal imperfection. Preferably, the crystal imperfection is surrounded and delimited on all sides by undisturbed material of the carrier wafer. In this connection, "undisturbed material" means that no crystal imperfections are introduced into this material in a targeted manner. By way of example, the crystal imperfection is, therefore, delimited to a region within the carrier wafer. In other words, preferably no externally visible damage to the carrier wafer such as, for example, material chippings or microstructure changes is evident after the crystal imperfection has been introduced into the earner wafer.

The at least one crystal imperfection may be introduced via the second surface of the carrier wafer. Advantageously, the component layer sequences applied on the first surface are not damaged during the process of introducing the crystal imperfection.

A step c) of the method may involve singulating the carrier wafer along the at least one crystal imperfection into individual semiconductor chips, wherein each semiconductor chip comprises at least one component layer sequence. By way of example, each semiconductor chip comprises a plurality of component layer sequences. It is likewise possible for each semiconductor chip to be assigned a component layer sequence one-to-one. During singulation, fracture nuclei are produced proceeding from the crystal imperfection, the fracture nuclei continuing in the direction of the two surfaces of the carrier wafer. That is to say, that the carrier wafer is singulated from the "inside" out, that is to say proceeding from the crystal imperfection. It is possible by the method to produce semiconductor chips having an n-gonal base area in a plan view, for example, where n≥3. In this case, it is also possible, in particular, for the semiconductor chips to have a base area which does not correspond to a regular n-gon, but rather has as many corners and edges as desired.

First, a step a) may involve providing a carrier wafer which has a first surface and a second surface opposite the first surface. A plurality of individual component layer sequences spaced apart from one another in a lateral direction are applied on the first surface, the component layer sequences in each case being separated from one another by separation trenches. Each component layer sequence has at least one active zone suitable for generating electromagnetic radiation. A next step b) may involve introducing at least one crystal imperfection in at least one region of the carrier wafer which at least partly overlaps an separation trench in a vertical direction. A farther step c) may involve singulating the carrier wafer along the at least one crystal imperfection into individual semiconductor chips, wherein each semiconductor chip comprises at least one component layer sequence. In this case, step b) can also take place before or after step a).

In this case, the method described here for producing a plurality of optoelectronic semiconductor chips is based on the insight, inter alia, that production of semiconductor chips is often accompanied by material damage in edge regions of the subsequent semiconductor dups. If a carrier wafer is singulated by high-energy laser light, for example, material fractures such as, for example, macroscopic cracks in the carrier wafer and/or chippings, which can damage the subsequent semiconductor chip in particular with regard to its radiation properties, occur on account of the high thermal loading of the incident laser light in the region of irradiation. Likewise, singulation, for example, by separation by grinding, in particular in the region of the surfaces of the carrier wafer, can equally lead to material chippings. Singulation-associated damage to component layer sequences applied on the carrier wafer can admittedly be avoided by the component layer sequences being arranged on the carrier wafer at a larger distance from one another, but this leads to a reduction of the chip yield since fewer individual component layer sequences find space on the surface of the carrier wafer.

To attain a method for producing optoelectronic semiconductor chips which is gentle in respect of material and also cost-effective, our method uses the concept of first providing a carrier wafer, on which component layer sequences spaced apart from one another in a lateral direction are applied. The component layer sequences are in each case separated from one another by separation trenches. A next step involves introducing at least one crystal imperfection in at least one region of the carrier wafer which at least partly overlaps a separation trench in a vertical direction. In this case, introduction can be effected via a surface of the carrier wafer remote from the component layer sequences. After the crystal imperfection has been introduced, the carrier wafer remains in one piece. In other words, the carrier wafer is not already singulated into individual semiconductor chips, for example, after the crystal imperfection has been introduced. It is only in a next step that the carrier wafer is singulated into individual semiconductor chips along the at least one crystal imperfection. In contrast to methods in which the carrier wafer is singulated from the "outside", for example, by separation by grinding, the carrier wafer is singulated into individual semiconductor chips proceeding from the crystal imperfection from the "inside" out by our method. Advantageously, semiconductor chips produced by such a method have, at side areas or edge regions, minimum mechanical and resultant electrical damage caused by the singulation. Such gentle singulation furthermore makes it possible to choose the separation trenches between individual component layer sequences to be as small as possible such that a largest possible number of component layer sequences find a space on a carrier wafer having a predefinable size. In this respect, the chip yield is greatly increased, as a result of which the method additionally becomes considerably more cost-effective.

The crystal imperfection may be produced by action of laser light in the region of the carrier wafer which at least partly overlaps a separation trench in a vertical direction. By way of example, for this purpose, the laser light is concentrated in a vertical direction centrally within the carrier wafer at a focusing point. The laser beam has a wavelength coordinated with the material of the carrier wafer such that the laser light is not completely absorbed by the material of the carrier wafer. By way of example, the laser light is an oscillating short-pulse light. In this case, optical absorption of the laser wavelength by the carrier wafer is permitted neither to be too high, since otherwise the surface structure of the carrier wafer would be damaged, nor is the optical absorption permitted to be too low, since otherwise the extent of the crystal imperfection within the carrier wafer would turn out to be too small. This makes use of the fact that non-linear absorption effects occur in the carrier wafer such that, at predefinable points within the carrier wafer, a maximally high absorption takes place at at least the focusing points. It the laser beam radiates into the focusing point, then the crystal imperfection propagates, proceeding from the focusing point, within the carrier wafer, for example, in spherical fashion or in the form of an ellipsoid. In this case, both the wavelength of the laser light and the irradiation duration are dimensioned such that the crystal imperfection preferably does not continue as far as the two surfaces of the carrier wafer such that the crystal imperfection is surrounded on all sides by undisturbed material of the carrier wafer.

The method may additionally comprise a step d), according to which an intermediate carrier is applied to the second surface of the carrier wafer. By way of example, the intermediate carrier is a flexible, elastic film. That is to say, in particular, that the film can be deformed, for example, under external mechanical loading and at least partly reverts to its initial form again after mechanical loading. By way of example, the intermediate carrier is a plastic film. Preferably, the intermediate carrier is laminated onto the second surface of the carrier wafer such that the intermediate carrier is mechanically fixedly connected to the carrier wafer.

The method may additionally comprise a step e) according to which the intermediate carrier is expanded after step d). That is to say that the intermediate carrier is exposed to tensile forces, for example, under external mechanical stress such that the intermediate carrier is deformed at least in places under such stress.

Expansion of the intermediate carrier may be carried out in a lateral and/or in a vertical direction. As a result of the different expansion behavior of carrier wafer and intermediate carrier, on account of tensile forces applied to the intermediate carrier and transmitted into the carrier wafer proceeding from the intermediate carrier, tensile forces and/or compressive forces are also produced in the region of the crystal imperfections of the carrier wafer. Proceeding from the crystal imperfections, fracture nuclei, for example, further crystal imperfections are then generated in the carrier wafer, which preferably continue in a vertical direction towards the two surfaces of the carrier wafer such that individual fracture areas are produced in the carrier wafer by expansion of the intermediate carrier. Preferably, expansion is carried out such that the carrier wafer is singulated into individual semiconductor chips by the expansion. Advantageously, no carrier material is removed by such singulation as a result of which the width of a cutting trench between the individual semiconductor chips produced by the separation is very small. Likewise, no particles of the carrier wafer, for example, which can produce electrical or optical damage at or in the chip are removed by the separation process. In addition, the semiconductor chips have no mechanical damage in edge regions, for example, the side areas as a result of which a semiconductor chip arises which is significantly more stable, for example, with regard to the optical properties.

An intermediate layer may be arranged between the component layer sequences and the carrier wafer, wherein the intermediate layer is in direct contact both with the carrier wafer and the component layer sequences. The intermediate layer is a ductile layer. A "ductile" layer is a layer having the property that, in the case of mechanical overloading, it first deforms plastically to a high degree before it fails. By way of example, the intermediate layer is a layer formed with a metallic solder or a plastic adhesive. The component layer sequences are then adhesively bonded onto the intermediate layer.

The method may additionally comprise a step f) according to which, at least in places, the intermediate layer is removed from the first surface of the carrier wafer in the region of at least one separation trench. The cracks in the carrier wafer material caused by the singulation usually do not continue right into the intermediate layer applied to the first surface of the carrier wafer, but rather end at the two surfaces of the carrier wafer. Without the removal of the intermediate layer in such a region of the first surface of the carrier wafer, the intermediate layer could cover and bridge the individual cracks in the carrier wafer. Singulation into individual semiconductor layers could therefore be made more difficult by the intermediate layer. By way of example, step f) can take place directly after step a). It is likewise conceivable for step f) to take place only after step b), for example.

The carrier wafer may be formed with silicon. By way of example, the carrier wafer consists completely of silicon, it is likewise conceivable for the carrier wafer to be formed with other semiconductor materials, for example, germanium or sapphire, or to consist of the aforementioned materials.

The method may additionally comprise a step g), according to which, at least in places, a connecting layer is applied to free locations of the first surface of the carrier wafer and of the component layer sequences.

The method may additionally comprise a step h) according to which an auxiliary carrier is applied to the connecting layer, the auxiliary carrier being removed again at least in places from the component layer sequences after step d). By way of example, the auxiliary carrier is applied to the intermediate layer after the crystal imperfections have been introduced into the carrier wafer. The auxiliary carrier is preferably a a plate or a wafer carrier. The auxiliary carrier stabilizes the assemblage composed of component layer sequence and carrier wafer. It is thus advantageously ensured that undesirable mechanical damage, for example, cracks do not already arise in the carrier wafer as early as before application to the intermediate carrier.

Furthermore, it should be pointed out that the steps presented here do not constitute a predefined, for example, sequential order of steps for producing the optoelectronic semiconductor chips. Rather, the individual steps can be combined with one another as desired. This results advantageously in a method sequence which is as flexible as possible and in which different method steps can be coordinated with the respective manufacturing requirements.

Furthermore, an optoelectronic semiconductor chip comprising a carrier and at least one component layer sequence is also specified.

By way of example, the optoelectronic semiconductor chip can be produced by our method such as has been described in conjunction with one or more of the examples mentioned above. That is to say that the features mentioned for the method described here are also disclosed for the semiconductor chip disclosed here and vice versa.

The carrier has a first surface and a second surface opposite the first surface and is laterally delimited by at least one side area. The at least one side area connects the first and the second surfaces to one another.

The at least one component layer sequence may have at least one active zone suitable for generating electromagnetic radiation.

The component layer sequence may be arranged on the first surface.

The at least one side area may have at least one undisturbed region and at least one disturbed region. In this case, "region" means a two-dimensional area which forms the side area in places. Preferably, the at least one side area is completely formed by the undisturbed region and the disturbed region.

The at least one disturbed region may have a multiplicity of crystal imperfections arranged in a lateral direction. "Lateral" means parallel to the first and/or to the second surface of the carrier. The at least one disturbed region can then be formed at least partly by the crystal imperfections.

The at least one disturbed region, in a vertical direction, may be spaced apart from the at least one undisturbed region or adjacent to the at least one undisturbed region. "Vertical" means perpendicular to the first and/or to the second surface of the carrier. If the at least one side area has exactly one disturbed region, for example, then it is possible for the disturbed region to be adjacent to two undisturbed regions in a vertical direction, wherein the undisturbed regions then delimit the disturbed region on both sides, for example. That is to say that the disturbed region then extends along the at least one side area in a lateral direction, for example, continuously and circumferentially and directly adjoins the undisturbed regions in a vertical direction.

Furthermore, the undisturbed region is free or substantially free of the crystal imperfections. In this case, "substantially free" means that the density of crystal imperfections is significantly lower in the undisturbed region than in the disturbed region. In this case, the undisturbed region and the disturbed region need not be "sharply" demarcated from one another in a vertical direction.

The at least one side area may have at least two disturbed regions arranged in a vertical direction separated from one another in each case by an undisturbed region in a vertical direction.

The at least one side area may comprise two disturbed regions arranged in a vertical direction which directly adjoin one another at least in places. By way of example, the two disturbed regions merge into one another at an interface and are then not separated by an undisturbed region.

It is possible for the disturbed regions to differ in terms of the number of crystal imperfections and/or an arrangement density of the crystal imperfections.

Two or more disturbed regions are preferably used for a carrier having a particularly large thickness.

A contact layer may be applied to the second surface of the carrier. The contact layer may be an electrically conductive material, for example, a metal, which serves for making contact with the optoelectronic semiconductor chip.

Our method described here and also our optoelectronic semiconductor chip are explained in greater detail below on the basis of examples and the associated figures.

In the examples and the figures, identical or identically acting constituent parts are in each case provided with the same reference symbols. The elements illustrated should not be regarded as true to scale; rather, individual elements may be illustrated with an exaggerated size in order to afford a better understanding.

FIG. 1 shows a step a), where first, a carrier wafer 1 having a first surface 11 and a second surface 12 opposite the first surface 11, is provided. An intermediate layer 8 is applied to the first surface 11 of the carrier wafer 1. By way of example, the intermediate layer 8 is formed with an electrically conductive solder or an adhesive. In other words, the intermediate layer 8 is in direct contact with the first surface 11 of the carrier wafer 1. Furthermore, the carrier wafer 1 consists of silicon. A plurality of component layer sequences 2 are adhesively bonded, for example, on a surface of the intermediate layer 8 remote from the carrier wafer 1. The individual component layer sequences 2 are spaced apart from one another in a lateral direction by separation trenches 3. Each of the component layer sequences 2 has at least one active zone 21 suitable to generate electromagnetic radiation. In this case, therefore, the carrier wafer 1, the intermediate layer 8 and the component layer sequences 2 form an assemblage 30. It is likewise possible for the assemblage 30 to be an assemblage of thin-film light-emitting diode chips. The component layer sequences 2 can then comprise metallic and/or dielectric layers. Furthermore, the carrier wafer 1 is then a carrier substrate that differs from a growth substrate.

FIG. 2 shows a step f) wherein the intermediate layer 8 is removed from the first surface 11 of the carrier wafer 1 in places it the region 31 of an separation trench 3. Alternatively, it is possible for the intermediate layer 8 to be embrittled in the region 31. That is to say that the intermediate layer 8 then becomes deformable to a lesser degree as a result of the embrittlement and fractures form in the material of the intermediate layer 8, for example, already after low external mechanical or electronic loading.

FIG. 3 illustrates a step b) according to which crystal imperfections are introduced into each region 41 of the carrier wafer 1, which completely overlap the separation trenches 3 in a vertical direction. For this purpose, high-energy laser light 411 is focused via the second surface 12 of the carrier wafer 1 into a focusing point P within the carrier wafer 1. By way of example, the focusing point P is situated centrally in the carrier wafer 1 in a vertical direction. In this case, the laser light 411 is infrared laser light, for example, at a wavelength of 1064 nm. The optical absorption of the laser wavelength is dimensioned such that although crystal imperfections 4 are introduced into the carrier wafer, the crystal imperfections 4 do not lead to any structural fractures as a result of the laser light 411 in the material of the carrier wafer 1, that is to say in the silicon. This ensures that crystal imperfections induced by the laser light 411 proceeding from the focusing point P do not continue as far as the surfaces 11 and 12 of the carrier wafer 1 and fractures in the carrier wafer 1 do not already occur directly after irradiation by the laser light 411. In other words, the carrier wafer 1 remains in one piece after irradiation by the high-energy laser light 411. Advantageously, the carrier wafer 1 has neither material fractures nor, for example, material chippings in the silicon after irradiation by the laser light 411 at surfaces 11 and 12. By way of example, after the laser light 411 has been radiated onto the carrier wafer 1, the crystal imperfections 4 are arranged in a lattice-network-like or grid-like manner in the carrier wafer 1.

FIG. 4 illustrates steps g) and h). In a step g), first, a connecting layer 5 is applied to uncovered locations of the surface 11 of the intermediate layer 8 and of the component layer sequences 2.

In a next step h), an auxiliary carrier 6 is applied to the connecting, layer 5. By way of example, the auxiliary carrier 6 is a plastic wafer which is a wafer or a plate. The plastic wafer 6 mechanically stabilizes the assemblage 30 by way of the connecting layer 5.

Figure 5:
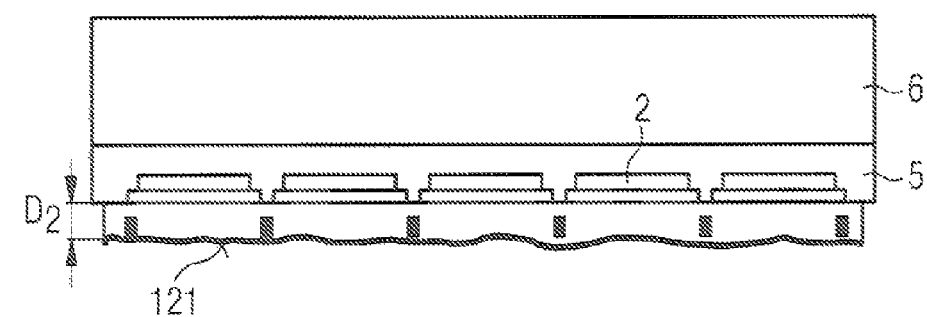

FIG. 5 illustrates a step h1), wherein, from the second surface 12 of the carrier wafer 1, the earlier wafer 1 is reduced from a thickness $D_1$ to a thickness $D_2$. By way of example, this can be done by a material removal of the silicon by grinding. Preferably, the grinding damage is removed again from the carrier wafer 1 after thinning by grinding. After the grinding-away, the carrier wafer 1 has as rough surface 121. By way of example, after thinning by grinding, the rough surface 121 can be smoothed again by polishing and further surface treatment steps. Such a reduction of the thickness of the carrier wafer 1 advantageously leads to an assemblage 30 having a significantly smaller vertical extent.

Figure 6:
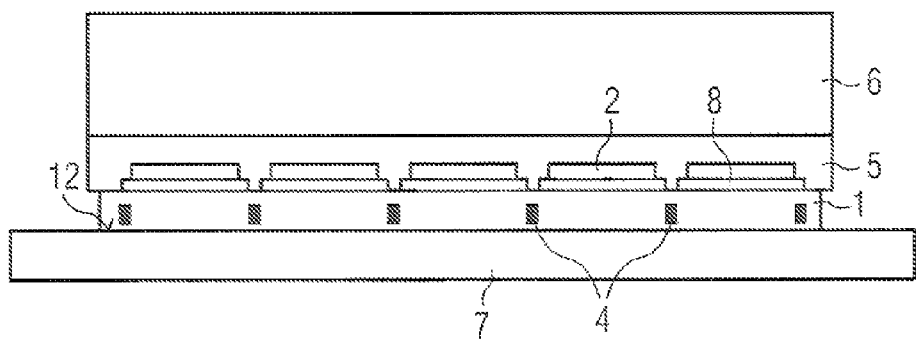

FIG. 6 shows a step d), wherein an intermediate carrier 7 is applied to the second surface 12 of the carrier wafer 1. By way of example, the intermediate carrier 7 is laminated onto the second surface 12. Preferably, the intermediate carrier 7 and the carrier wafer 1 are then mechanically fixedly connected to one another. The intermediate carrier 7 can be a flexible plastic film which can be deformed more easily in comparison with the carrier wafer 1 under external mechanical stress.

Figure 7:
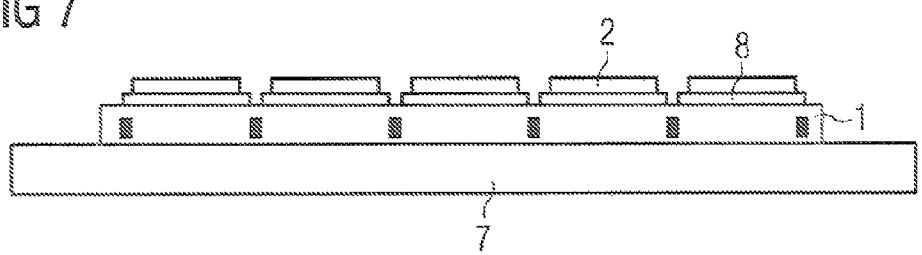

In a next step d1), shown in FIG. 7, both the auxiliary carrier 6 and the connecting layer 5 are removed again from the assemblage 30 at least in places.

Figure 8:
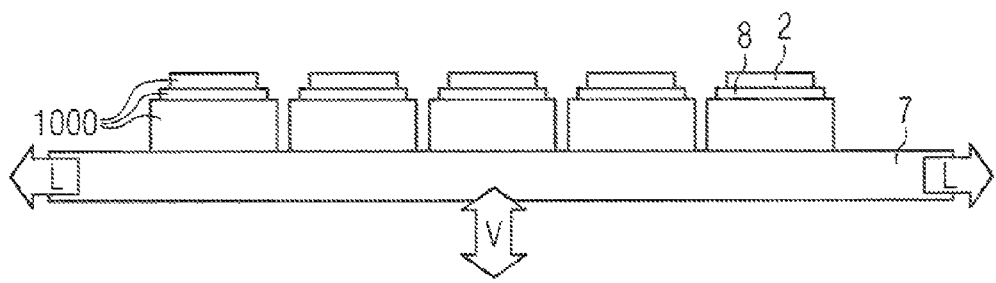

FIG. 8 shows next steps c) and e), wherein first, external mechanical and/or electrical forces are applied to the intermediate carrier 7 in a lateral direction L. In other words, the intermediate carrier 7 is expanded by the external mechanical forces. The tensile and/or compressive strains arising within the intermediate carrier 7 as a result of the expansion of the intermediate carrier 7 continue into the carrier wafer 1 on account of the mechanically fixed connection between intermediate carrier 7 and carrier wafer 1. On account of the crystal imperfections 4 within the carrier wafer 1, the forces induced into the carrier wafer 1 by the tensile and/or compressive strains then cause cracks. Preferably the cracks, proceeding from the crystal imperfections 4, continue in the direction both of the surface 11 and of the surface 12 of the carrier wafer 1. This cracking gives rise to individual fractures arising in a vertical direction, preferably in the regions 41 of the carrier wafer 1, on account of which the assemblage 30 is singulated into individual optoelectronic semiconductor chips 1000. The expansion of the assemblage 30 in a vertical direction V, for example, by wedge, roller or tape breaking installations is also conceivable.

Figure 9:
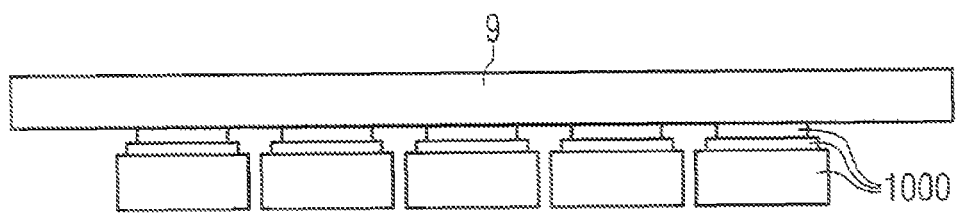
Figure 10:
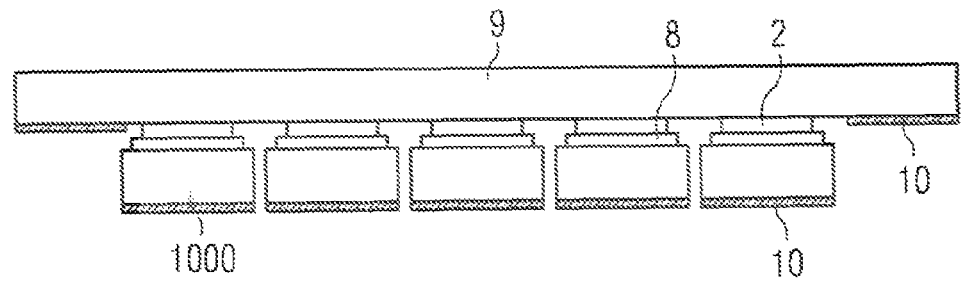

FIGS. 9 and 10, respectively, illustrate further method steps e1) and e2), in step e1), first, after singulation, a further intermediate carrier 9 is applied to those surfaces of the component layer sequences 2 remote from the intermediate carrier 7. After application, the intermediate carrier 7 can then be removed from the individual semiconductor chips 1000. In other words, those surfaces of the individual semiconductor chips 1000 remote from the further intermediate carrier 9 are then uncovered.

In a step e2), a contact layer 10 is applied to those surfaces of the optoelectronic semiconductor chips 1000 remote from the further intermediate carrier 9. In this case, the contact layer 10 can advantageously be applied without a prior structuring since use is made of the fact that after singulation the lateral distance between individual semiconductor chips 1000 on the further intermediate carrier 9 is significantly smaller than the thickness $D_2$ of the carrier wafer 1. Thus, by way of example, the chip flanks are protected against an impermissibly high degree of coating by the contact layer 10.

FIG. 11 illustrates a method flowchart in accordance with the method sequence illustrated in FIGS. 1 to 10. FIG. 11, therefore, describes a manufacturing order F1 comprising the following order of steps: a), f), b), g), h), h1), d), d1), c), e), e1), e2).

It is also possible to deviate from the above-mentioned order of steps. In this context, it is possible for the contact layer 10 to be applied before the intermediate carrier 7 is applied. Furthermore, the contact layer 10 can additionally be previously structured by a lithographic method, for example. In other words, a manufacturing order F2 is then possible: a), f), b), g), h1), e2), d), d1), c), e).

Furthermore, a manufacturing order F3 deviating from the above-mentioned manufacturing order F1 is also possible. In this case, by way of example, in a manner deviating from the manufacturing variant F1, step h1), which is illustrated in FIG. 5 and according to which the carrier wafer 1 is thinned by grinding from the surface 12, takes place before step b), that is to say before the crystal imperfections 4 are introduced into the carrier wafer 1. The manufacturing order F3 could then read as follows: a), g), h), h1), f), b, d), d1), c), e), e1), e2).

Furthermore, it should be pointed out that the individual manufacturing sequences F1 to F3 can also be combined with one another as required. Advantageously, this results in a method sequence which is as flexible as possible and in which different method steps can be coordinated with the respective manufacturing requirements.

FIGS. 12A and 12B show an optoelectronic semiconductor chip 1000 in a schematic side view and plan view.

As illustrated in FIG. 12A, the optoelectronic semiconductor chip 1000 has a carrier 100. A first surface 11 and a second surface 12 of the carrier 100 are opposite one another. The first surface 11 and the second surface 12 connect to four side areas 110 (also see FIG. 12B). The four side areas 110 delimit the carrier 100 in a lateral direction. However, the optoelectronic semiconductor chip 1000 can also have a number of side areas that deviates from that that illustrated in FIG. 12A. By way of example, the first 11 and/or the second surface 12 of the carrier 100 can have n-gons, where n≥3. For example, the carrier 100 of the optoelectronic semiconductor chip 1000 then has a hexagonal form in a plan view.

The carrier 100 consists of silicon, wherein the intermediate layer 8 applied on the first surface 11 is formed with a solder or a plastic adhesive. The component layer sequence 2 is adhesively bonded on a surface of the intermediate layer 8 remote from the carrier 100. The component layer sequence 2 is based on a nitride-based compound semiconductor material. Furthermore, the component layer sequence 2 has an active zone 21 suitable for generating electromagnetic radiation. For the purpose of making electrical contact, an electrical contact layer 10 is applied to the second surface 12 of the carrier 100.

Each of the side areas 110 is formed by an undisturbed region 110A and two disturbed regions 110B. The disturbed region 110B has a multiplicity of crystal imperfections 4 arranged in a lateral direction. In this case, the crystal imperfections 4 extend over the entire vertical extent of the disturbed region 110B. Undisturbed material can be situated between the individual crystal imperfections 4 in a lateral direction. Furthermore, the disturbed region 110B is delimited by the undisturbed regions 110A on both sides in a vertical direction.

Furthermore, the undisturbed regions are free of the crystal imperfections. In other words, each of the disturbed regions 110B is delimited by undisturbed material of the undisturbed region 110A in a vertical direction.

A further example in accordance with an optoelectronic semiconductor chip 1000 described here is shown in a schematic side view in FIG. 13. In contrast to the semiconductor chip 1000 shown in FIG. 12A, the side areas 110 have two disturbed regions 110B arranged in a vertical direction. In this case, the disturbed regions 110B are separated from an undisturbed region in a vertical direction. The two undisturbed regions 110A directly adjoin both the first 11 and the second surface 12. In other words, an undisturbed region 110A respectively alternates with a disturbed region 110B in a vertical direction proceeding from the two surfaces 11 and/or 12 along the side areas 110.

Our methods and chips are not restricted by the description on the basis of the examples. Rather, this disclosure encompasses any novel feature and also any combination of features, which in particular includes any combination of features in the appended claims. Even if this feature or combination itself is not explicitly specified in the claims and/or the examples.

The invention claimed is:
1. A method of producing a plurality of optoelectronic semiconductor chips comprising:
 a) providing a carrier wafer having a first surface and a second surface opposite the first surface, wherein a plurality of individual component layer sequences spaced apart from one another in a lateral direction are applied on the first surface, said component layer sequences each being separated from one another by separation trenches, and wherein an intermediate layer is arranged between the component layer sequences and the carrier wafer, and the intermediate layer is in direct contact both with the carrier wafer and the component layer sequences;

b) introducing at least one crystal imperfection in at least one region of the carrier wafer which at least partly overlaps a separation trench in a vertical direction;

c) removing at least portions of the intermediate layer from the first surface of the carrier wafer in a region of at least one separation trench so that the intermediate layer is completely punctuated in the region of the at least one separation trench in which the intermediate layer was removed or embrittling the intermediate layer in a region of at least one separation trench so that the intermediate layer becomes deformable to a lesser extent, wherein the region in which the intermediate layer was removed or embrittled overlaps with the crystal imperfection in a vertical direction at least partially; and d) singulating the carrier wafer along the at least one crystal imperfection into individual semiconductor chips, wherein each semiconductor chip comprises at least one component layer sequence.

2. The method according to claim 1, wherein the crystal imperfection is produced by laser light in a region of the carrier wafer which at least partly overlaps a separation trench in a vertical direction.

3. The method according to claim 1, further comprising e) applying an intermediate carrier to the second surface of the carrier wafer.

4. The method according to claim 3, further comprising g) applying at least in places, a connecting layer to free locations of the first surface of the carrier wafer and of the component layer sequences.

5. The method according to the preceding claim 4, further comprising h) applying an auxiliary carrier to the connecting layer, said auxiliary carrier being removed again at least in places from the component layer sequences after d).

6. The method according to claim 3, further comprising f) expanding the intermediate carrier after d).

7. The method according to claim 6, wherein expansion of the carrier wafer is carried out in a lateral (L) and/or in a vertical direction (V).

8. The method according to claim 1, wherein the carrier wafer is formed with silicon.

9. A method of producing a plurality of optoelectronic semiconductor chips comprising steps:

a) providing a carrier wafer having a first surface and a second surface opposite the first surface, wherein a plurality of individual component layer sequences spaced apart from one another in a lateral direction are applied on the first surface, said component layer sequences each being separated from one another by separation trenches;

b) introducing at least one crystal imperfection in at least one region of the carrier wafer which at least partly overlaps a separation trench in a vertical direction;

c) applying an intermediate carrier to the second surface of the carrier wafer;

d) singulating the carrier wafer along the at least one crystal imperfection into individual optoelectronic semiconductor chips, wherein each semiconductor chip comprises at least one component layer sequence;

e1) applying a further intermediate carrier to surfaces of the component layer sequences remote from the intermediate carrier, wherein after this the intermediate carrier is removed from the individual optoelectronic semiconductor chips; and e2) applying a contact layer to surfaces of the individual optoelectronic semiconductor chips remote from the further intermediate carrier, wherein the steps are performed in the indicated order.

10. A method of producing a plurality of optoelectronic semiconductor chips comprising:

a) providing a carrier wafer having a first surface and a second surface opposite the first surface, wherein a plurality of individual component layer sequences spaced apart from one another in a lateral direction are applied on the first surface, said component layer sequences each being separated from one another by separation trenches;

b) introducing at least one crystal imperfection in at least one region of the carrier wafer which at least partly overlaps a separation trench in a vertical direction;

c) applying at least in places a connecting layer to free locations of the first surface of the carrier wafer and of the component layer sequences;

d) applying an auxiliary carrier to the connecting layer;

e) applying an intermediate carrier to the second surface of the carrier wafer, wherein after this said auxiliary carrier is removed at least in places from the component layer sequences; and f) singulating the carrier wafer along the at least one crystal imperfection into individual semiconductor chips, wherein each semiconductor chip comprises at least one component layer sequence, wherein the steps are performed in the indicated order.

* * * * *